United States Patent
Wu et al.

(10) Patent No.: US 9,570,595 B2
(45) Date of Patent: Feb. 14, 2017

(54) TRANSISTOR AND METHOD OF MAKING

(71) Applicants: Dongping Wu, Shanghai (CN); Chaochao Fu, Shanghai (CN); Wei Zhang, Shanghai (CN); Shi-Li Zhang, Stockholm (SE)

(72) Inventors: Dongping Wu, Shanghai (CN); Chaochao Fu, Shanghai (CN); Wei Zhang, Shanghai (CN); Shi-Li Zhang, Stockholm (SE)

(73) Assignee: FUDAN UNIVERSITY, Shanghai (CN)

( * ) Notice: Subject to any disclaimer, the term of this patent is extended or adjusted under 35 U.S.C. 154(b) by 266 days.

(21) Appl. No.: 13/704,613

(22) PCT Filed: Dec. 14, 2012

(86) PCT No.: PCT/CN2012/086610
§ 371 (c)(1),
(2) Date: May 30, 2014

(87) PCT Pub. No.: WO2014/089813
PCT Pub. Date: Jun. 19, 2014

(65) Prior Publication Data
US 2016/0190293 A1 Jun. 30, 2016

(51) Int. Cl.
*H01L 29/737* (2006.01)
*H01L 29/66* (2006.01)
(Continued)

(52) U.S. Cl.
CPC ....... *H01L 29/7378* (2013.01); *H01L 21/0257* (2013.01); *H01L 21/02598* (2013.01); *H01L 21/2855* (2013.01); *H01L 21/28518* (2013.01); *H01L 29/0817* (2013.01); *H01L 29/0821* (2013.01); *H01L 29/1004* (2013.01); *H01L 29/165* (2013.01); *H01L 29/167* (2013.01); *H01L 29/41708* (2013.01);
(Continued)

(58) Field of Classification Search
CPC .......... H01L 29/66242; H01L 29/7378; H01L 29/7371
See application file for complete search history.

(56) References Cited

U.S. PATENT DOCUMENTS 4,717,681 A * 1/1988 Curran .............. H01L 21/02381
257/197
5,162,263 A * 11/1992 Kunishima ......... H01L 21/2257
148/DIG. 19

(Continued)

*Primary Examiner* — Anthony Ho
*Assistant Examiner* — Victor Barzykin
(74) *Attorney, Agent, or Firm* — Jamie J. Zheng, Esq.

(57) ABSTRACT

A SiGe HBT has an inverted heterojunction structure, where the emitter layer is formed prior to the base layer and the collector layer. The frequency performance of the SiGe HBT is significantly improved through a better thermal process budget for the base profile, essential for higher cut-off frequency ($f_T$) and a minimal collector-base area for a reduced parasitic capacitance, essential for higher maximum oscillation frequency ($f_{max}$). This inverted heterojunction structure can be fabricated by using ALE processes to form an emitter on a preformed epitaxial silicide, a base over the emitter and a collector over the base.

4 Claims, 12 Drawing Sheets

(51) Int. Cl.
*H01L 29/08* (2006.01)
*H01L 29/10* (2006.01)
*H01L 21/285* (2006.01)
*H01L 29/165* (2006.01)
*H01L 29/167* (2006.01)
*H01L 29/417* (2006.01)
*H01L 29/45* (2006.01)
H01L 21/02 (2006.01)

(52) U.S. Cl.
CPC ...... *H01L 29/456* (2013.01); *H01L 29/66242* (2013.01); *H01L 21/0262* (2013.01); *H01L 21/02532* (2013.01)

(56) References Cited

U.S. PATENT DOCUMENTS

| | | | | |
|---|---|---|---|---|
| 6,316,795 B1* | 11/2001 | Croke, III | ......... | H01L 29/66242 257/197 |
| 2001/0048117 A1* | 12/2001 | Uemura | ............. | H01L 29/0821 257/189 |
| 2008/0050883 A1* | 2/2008 | Enicks | ................. | H01L 29/161 438/312 |
| 2008/0128754 A1* | 6/2008 | Kim | .................... | H01L 29/0821 257/197 |
| 2011/0278586 A1* | 11/2011 | Ando | ................. | H01L 29/0649 257/76 |

* cited by examiner

TRANSISTOR AND METHOD OF MAKING

FIELD

The present invention is related electronic device technologies, and more particularly to a heterojunction bipolar transistor (HBT) capable of operating in the Tera Hertz range and its method of making.

BACKGROUND

In the 0.5-6 THz ($10^{12}$ Hz) frequency regime, imaging and spectrometric systems have important applications in security, health, remote sensing and basic sciences. Tera-Hertz waves are strongly attenuated by water, but have otherwise a large penetration-depth without causing damage to biological tissues. They are therefore particularly suitable for security applications involving low-risk imaging through opaque objects such as clothes, teeth, paper, plastic and ceramic materials. THz waves are also ideal in health applications such as early skin cancer diagnostics. Thus, extensive research lately has identified many society-essential applications in security, medicine, bioanalysis, remote sensing for environmental monitoring and natural disaster mitigation. With their high frequencies, THz waves are also well suited for extreme wideband communications.

The THz spectral region, however, has so far resisted most attempts to harness its potential for everyday applications. This has led to the expression 'the THz gap', which loosely describes the lack of adequate technologies to effectively bridge the region between microwave frequencies below 1 THz and optical frequencies above 6 THz, and more particularly, the lack of a practical source with a useful power level in this particular frequency range. Today, semiconductor electronics and laser optics work from opposite directions to narrow the THz gap. Advanced semiconductor technologies including silicon-CMOS, SiGe HBT and compound-semiconductor HEMTs (high electron mobility transistors) have greatly advanced the art in millimeter wave technology. Yet, the projected attainable frequency by the most robust and cost-effective SiGe HBT technology is currently about 0.5 THz. In the optics region, modern solid-state lasers that rely on transitions from well-defined electronic states encounter a severe challenge in breaking the 6-THz barrier, since such frequency is equivalent to kT=26 meV, the energy of thermal fluctuations at room temperature.

Presently, it is possible to enter the THz gap by means of passive devices such as frequency multipliers. However, such devices generally suffer from significant power losses, which lead to a power-to-system volume that will be impractically small when it comes to the applications. Small and efficient active THz devices are therefore the only solution. Vacuum electronic devices, including klystrons, have been considered as one way to bridge the THz gap. Such devices can perhaps find military and aerospace interest, but their large size, aggressive energy appetite and poor reliability are foreseen to prevent them from penetrating into the vast field of civilian applications for security and health. Solid-state electronics based on advanced semiconductors is therefore seen as the only possibility, especially for battery-powered portable THz systems for use in our everyday life.

CMOS-based solutions for 1 THz operation require transistors with a 10-nm channel length. At this gate length, however, very low output power is expected due to quantum tunneling. With superior transconductance and noise properties, SiGe HBT technology is generally considered to provide the most robust and cost-effective solutions for the emerging high-frequency markets. Currently, the enabling technology for SiGe HBT is chemical vapour deposited (CVD) SiGe. The most advanced SiGe HBT today has a maximum transit frequency of 0.4 THz at room temperature. An ongoing European FP7 effort named "DOTFIVE" comprising leading European semiconductor enterprises aims to bring 0.5 THz SiGe HBT technology to the market in 2013. Noteworthy in the DOTFIVE project is the current progress in circuit design of complete frequency multiplier chains for 0.325 THz, which is not only a very lossy method, but also fails to get into the TaraHertz gap.

SUMMARY

In one embodiment, a SiGe HBT can be formed by atomic layer epitaxy (ALE) for heterojunction formation of ultrathin (e.g., ~10 nm or less) semiconductors on epitaxial metal silicides. Strain engineering is used for simultaneous enhancement of lateral hole and vertical electron conduction in some or all regions of the HBT. The SiGe HBT has an inverted heterojunction structure, giving maximized frequency performance with reduced parasitics and better thermal processing budget for the critical base profile. The inverted heterojunction structure can be fabricated by using ALE processes to form an emitter layer on a preformed epitaxial silicide, a base layer over the emitter and a collector layer over the base. New contact strategies are employed to provide extremely low contact resistances at some or at all the HBT terminals.

The SiGe HBT can be fabricated using CMOS technology suitable for industrialization.

In one embodiment, an HBT comprises an ultrathin single crystalline epitaxial metal silicide layer having a thickness of 10 nm or less grown on a semiconductor substrate, a single crystalline silicon emitter formed over the metal silicide layer, a base formed over the emitter, the base having a width of about 10 nm or less; and a single crystalline silicon collector formed over the base. The HBT has an inverted architecture with the collector being close to a surface of the HBT.

In a further embodiment, the emitter is carbon doped.

In a further embodiment, the single crystal epitaxial metal silicide is an ultrathin epitaxial $NiSi_2$ films on a Si(100) substrate.

In a further embodiment, the emitter and the collector each has a thickness that is about 10 nm or less.

In a further embodiment, at least one of the emitter, the base, and the collector is formed by at least one ALE process.

In a further embodiment, the base comprises SiGe.

The HBT further comprises metal silicide contacts on the emitter, the base and the collector, respectively, the metal silicide contacts having very low resistivity of about 45 $\mu\Omega$-cm.

In a further embodiment, the collector is stressed in the transport direction to enhance electron mobility.

In a further embodiment, in the collector is lightly-doped and silicide-shunted.

In a further embodiment, the base is strain engineered to enhance lateral hole and vertical electron conduction in the base and is further stressed in an additional direction.

In one embodiment, a method of making an HBT for operating in the TeraHertz Gap comprises: epitaxially growing a single crystal metal silicide layer on a semiconductor substrate, the metal silicide layer having a thickness of 10 nm or less; epitaxially growing a single crystal silicon emitter on the metal silicide layer; epitaxially growing an SiGe base over the emitter; and epitaxially growing a single crystal silicon collector on the SiGe base.

In a further embodiment, the metal silicide layer is $NiSi_2$ grown on Si(100) using an SSR process, which comprises sputter-deposition of a ~2-nm thick Ni film and a brief heat treatment.

In a further embodiment, the emitter is grown using an ALE process, and is doped in situ with carbon during the ALE process.

In a further embodiment, photons from a laser source are used during the ALE process to help release hydrogen atoms from a substrate surface.

In a further embodiment, the Si emitter layer and the SiGe base layer are stress engineered, and the SiGe base layer is stressed in multiple directions.

In a further embodiment, because of the inverted architecture, mechanical stress is applied to the collector layer from a top surface of the HBT.

DESCRIPTION OF EMBODIMENTS

According to one embodiment of the present disclosure, a novel "inverted" silicon-germanium heterojunction bipolar transistor (SiGe HBT) device is developed to penetrate the THZ gap from the μW side. The SiGe HBT is fabricated using disruptive thin-film technology innovations with regard to materials, process technology and device architecture, such as solid-state reaction (SSR) epitaxy of $NiSi_2$ on Si as well as atomic layer epitaxy of Si on $NiSi_2$, and is capable of operating well into the THz gap.

Figure 1:
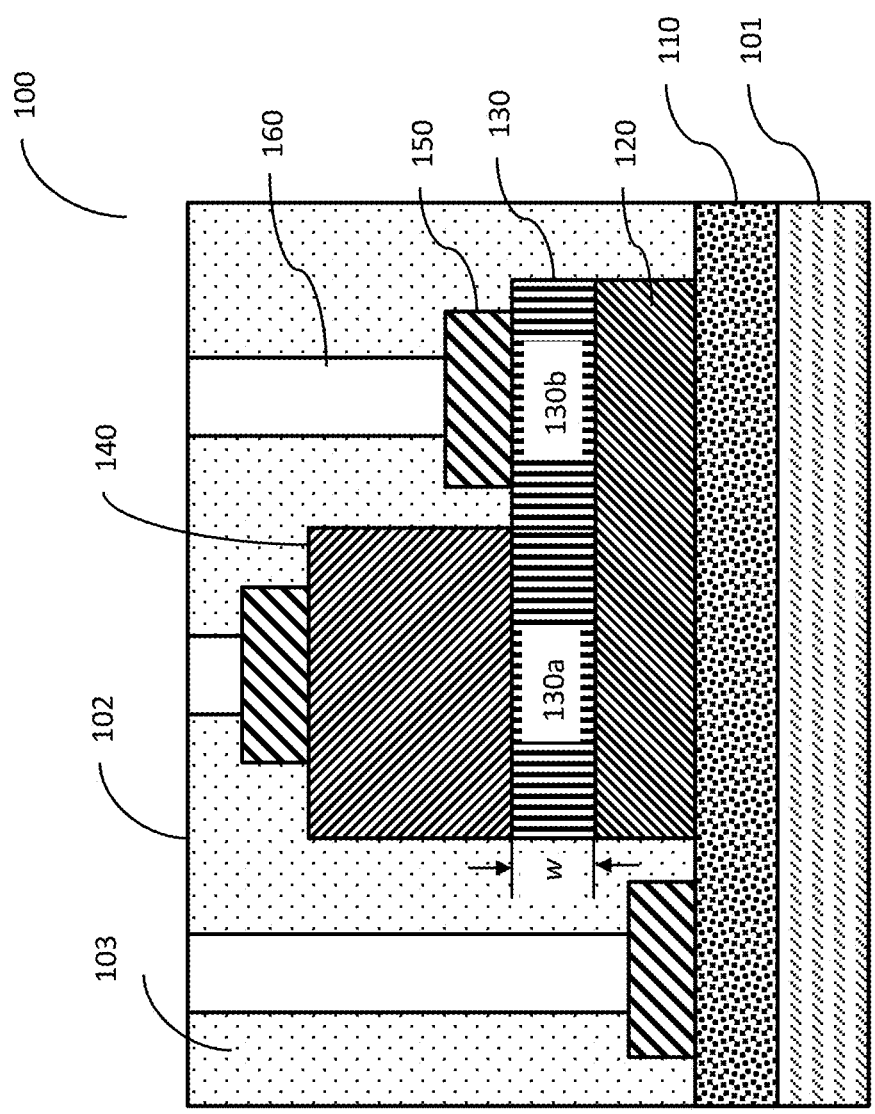
FIG. 1 is a cross-sectional block diagram illustrating a SiGe HBT device according to one embodiment.

FIG. 1 is a schematic cross sectional diagram of an inverted HBT 100 according to one embodiment of the present disclosure. As shown in FIG. 1, the inverted HBT 100 comprises an epitaxial layer 110 grown over a semiconductor (e.g., silicon) substrate 101, an emitter 120 formed over the epitaxial layer 110, a base 130 formed over the emitter layer 120, and a collector 140 formed over the base layer. Thus, the order of the emitter layer 120, the base layer 130 and the collector layer 140 in the inverted HBT 100 is reversed compared to conventional bipolar transistors. One of the benefits of this layout is that, unlike the emitter terminal in a conventional bipolar transistor, which is normally grounded in a collector-emitter (CE) configuration, the emitter layer in the HBT 100 is close to another low-potential region associated with the substrate 101. The collector layer on the other hand is near a top or surface 102 of the HBT 100, and is thus in closer or immediate contact with circuit metallization (not shown) associated with the HBT and is accessible from the top of the device. As a result, the effect of parasitics (particularly, collector-base capacitance $C_{bc}$) is significantly lessened and a gain in performance can be thus achieved.

In one embodiment, the epitaxial layer 110 comprises single-crystal silicide formed by a hetero-epitaxy process, and the emitter includes epitaxially grown silicon. In a further embodiment, the emitter includes carbon doped silicon (Si(C)) with a larger bandgaps than that of Si to achieve even more enhanced carrier injection. The epitaxial silicon emitter leads to good frequency performance because it can form a good heterojunction to the base, which can comprise Si or SiGe. In one embodiment, a base-width w is made very thin (e.g., ~10 nm or less) by means of an ALE method, so that the base transport time would not significantly limit the performance of the HBT.

Such an "inverted-bipolar" structure allows for simple dopant optimization of the collector layer so that a special heterojunction structure can be formed to allow the device to operate at much higher current densities in order to reach higher frequency limits. Furthermore, the inverted structure substantially simplifies the application of mechanical stress that is important for THz operation.

In one embodiment, the epitaxial layer 110 comprises epitaxial metal silicide with a sheet resistance of about 50 Ω/sq so as to minimise carrier transit time and series resistance, as well as to improve thermal management.

In one embodiment, the base layer comprises Si or SiGe. Higher operating frequency can be achieved by forming the base with SiGe. Although a Si base is also feasible, the discussion below is mainly focused on a HBT 100 with a SiGe base layer and the HBT 100 is referred to below as a SiGe HBT 100. In one embodiment, the base layer is strain engineered to enhance lateral hole and vertical electron conduction in the base. In one embodiment, stress is applied in an additional direction compared to that of an already-strained SiGe layer so as to substantially improve device performance. Well developed strain techniques, such as heterojunction epitaxy process and tensile/compressive nitride stressors, commonly employed in state-of-the-art CMOS technologies, can be similarly used for stress applications discussed herein.

In one embodiment, the base 130 of SiGe HBT 100 comprises an extrinsic base 130a and an intrinsic base 130b. In one embodiment, the intrinsic base has a thickness of about 10 nm or less. To avoid an unnecessarily high resistance for such a thin intrinsic base, the emitter stripe 120 is made extremely narrow (e.g., as narrow as about 20 nm or less), and the HBT 100 can have multiple emitter stripes to optimize performance. In one embodiment, the emitter is patterned using electron beam lithography or emersion lithography, in order to achieve high resolution.

In one embodiment, the collector comprises silicon and is strain engineered. In one embodiment, the collector is lightly-doped and silicide-shunted, and is stressed in the transport direction in order to enhance the electron mobility. The inverted architecture with the collector region close to the surface 102 allows controlled application of mechanical stress. In one embodiment, the silicide contact 150 on top of the collector can be as large as the size of the collector in order to minimize contact resistance.

In one embodiment, the SiGe HBT 100 further comprises low-resistivity contacts 150 at its terminals. For example, the contacts can be nickel silicide (NiSi) contacts with extremely low contact resistivities (e.g., below $10^{-8}$ $\Omega cm^2$)

at the emitter and base, and extremely low Schottky barrier height (SBH) (e.g., around 0.1 eV) at the collector.

In one embodiment, advanced ALE and epitaxial silicide techniques are employed to fabricate high-performance HBTs for operating frequencies beyond 1 THz. At such high frequencies, special attention should be focused on the minimization of all parasitic elements, internal as well as external, since they would otherwise have a detrimental influence on the active device.

The ALE processes with one atomic layer deposited at a time ensures that the atoms in a layer end up in the correct lattice positions during the low-temperature deposition. Thus, no additional high-temperature step is required, in comparison with conventional chemical vapor deposition (CVD) processes that require much higher deposition temperatures. In contrast to molecular beam epitaxy (MBE) that can also reach control of depositions at atomic scale, ALE is useful for obtaining narrow profiles that are desired for practical THz components. In one embodiment, ultrahigh vacuum (UHV) ALE is used to grow C-doped Si (denoted Si(C)) for the emitter, SiGe for the base and Si for the collector.

Figure 2:
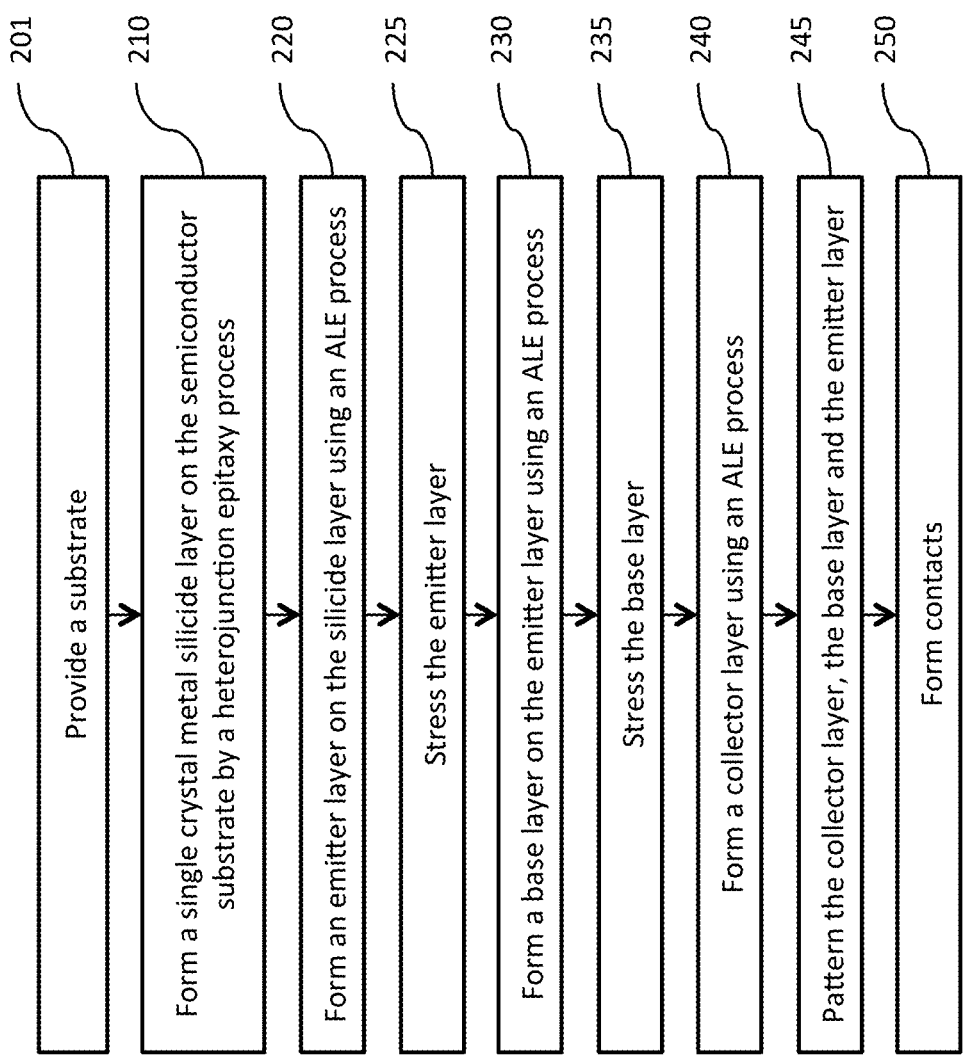
FIG. 2 is a flowchart illustrating a process of making the SiGe HBT device according to one embodiment.
Figure 3A:
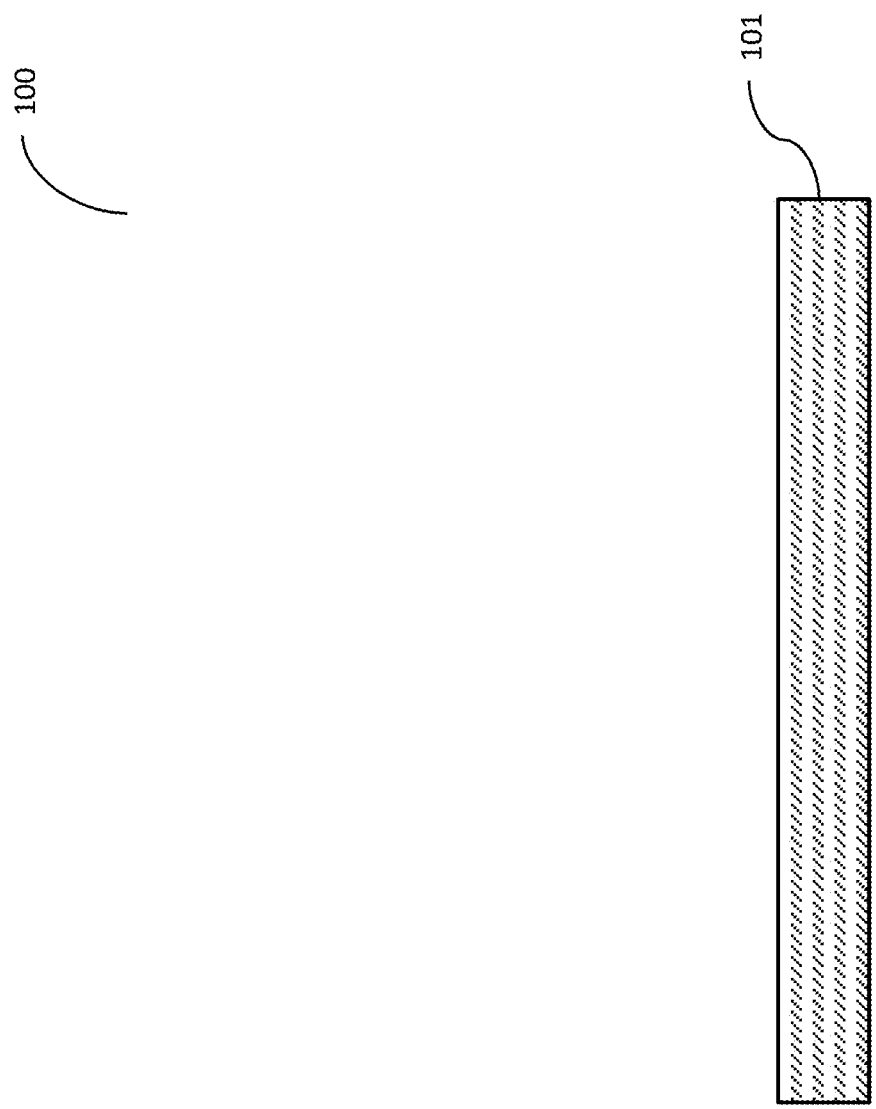
FIGS. 3a to 3h are cross-sectional block diagrams illustrating various stages in a process of making the SiGe HBT device according to one embodiment.

FIG. 2 is a flowchart illustrating a process 200 for making a SiGe HBT according to one embodiment of the present disclosure. FIGS. 3a-3h are cross-sectional diagrams illustrating the making of the SiGe HBT at various stages of the process 200. As shown in FIGS. 2 and 3a, a semiconductor substrate 301 is provided (Step 201). The semiconductor substrate 101 can be, for example, a silicon substrate or silicon-on-insulator (SOI) substrate.

Figure 3B:
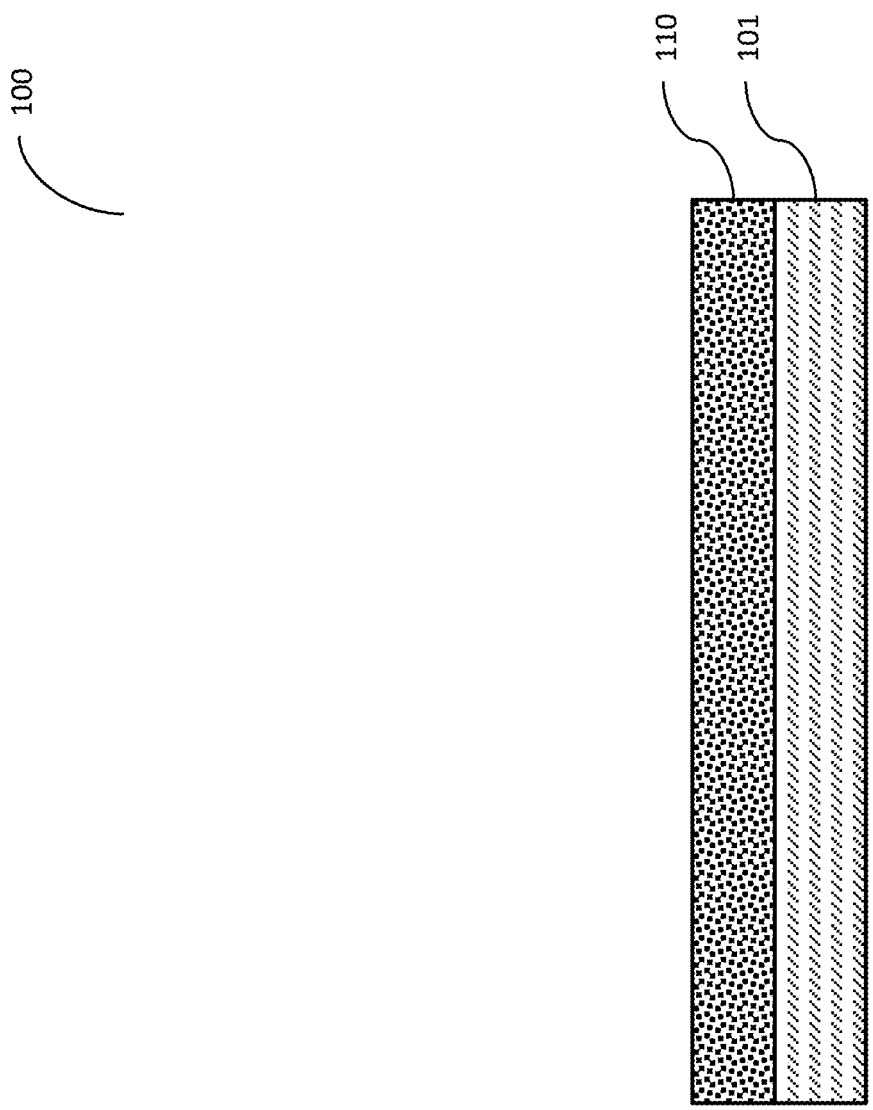

As shown in FIGS. 2 and 3b, a single crystal metal silicide layer 110 is formed on the semiconductor substrate by a heterojunction epitaxy process (Step 210). The epitaxial silicide layer 110 replaces the traditionally used thick and doped Si layer as a sub-collector with a sub-50Ω sheet resistance suitable for THz frequencies. Since the silicide layer can be extremely thin (≤10 nm), the parasitic fringing capacitance associated with any sidewalls of the sub-emitter should be drastically reduced.

Figure 4B:
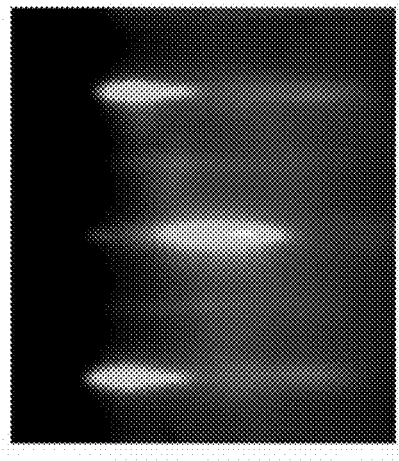
FIG. 4B is a RHEED image of a 10 nm thick epitaxial Si grown on $NiSi_2$ using molecular beam epitaxy.
Figure 4A:
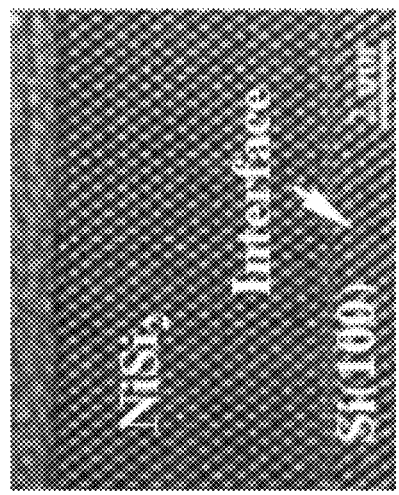
FIG. 4A is a transmission electron microscope (TEM) image of a 6 nm thick epitaxial $NiSi_2$ grown on Si (100) using SSR according to one embodiment.

In one embodiment, the epitaxial silicide layer 110 is an ultrathin (e.g., 10 nm or less) epitaxial $NiSi_2$ films on a Si(100) substrate grown using a solid-state reaction (SSR) process. In one embodiment, the SSR process starts with sputter-deposition of a ~2-nm thick Ni film and ends with a brief heat treatment at about 700° C. As shown in FIG. 4A, a 6 nm thick epitaxial $NiSi_2$ film thus grown on Si(100) is homogeneous in thickness and display a sharp interface and smooth surface at atomic-layer level. Moreover, this film is characterised by very low resistivity, e.g., 45 μΩ-cm, or a sheet resistance of about 75 Ω/sq.

Figure 3C:
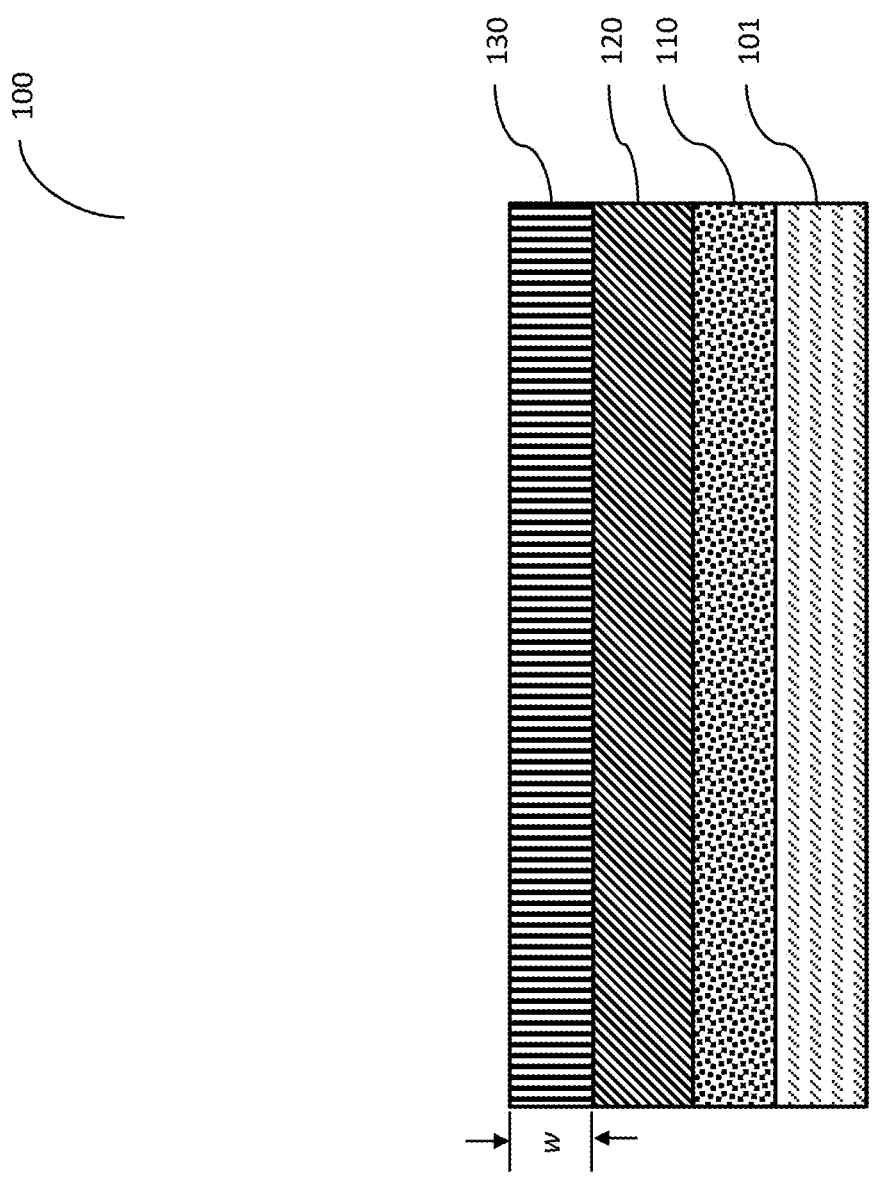

As shown in FIGS. 2 and 3c, a carbon doped silicon (Si(C)) emitter layer 120 and a SiGe base layer 130 are consecutively formed on the epitaxial silicide layer 110 using ALE processes (Steps 220 and 230, respectively). With the ALE processes, thickness and composition control can be achieved with monolayer precision, and different chemistries and materials can be handled swiftly. The emitter layer 120 is doped in situ in order to achieve an atomically sharp transition from one layer to another. An ALE process with a monolayer control capability generally relies on cyclic processing with two precursors for the constituents of deposited $A_xB_y$-type binary compounds such as III-V or II-VI semiconductors. A key feature with the ALE process 230 is the self-limiting nature achieved with the chemisorptions process in an ultra-high vacuum (UHV) environment at temperatures below 400° C. In this way, at most one monolayer of constituent A or B can be grown during each cycle, irrespectively of the cycle length. For growth of single-element Si films, the cyclic processing can be realized using $Si_2Cl_6$ and $Si_2H_6$. However, this process is not truly self-limiting, since $Si_2H_6$ is easily decomposed above 400° C. ALE of SiGe alloys for the base layer 130 is expected to be more difficult in this regard since Ge-precursors such as $GeH_4$ or $Ge_2H_6$ tend to decompose at even lower temperatures. To realize self-limiting at atomic layer level, the growth therefore should be performed at lower temperatures. A challenge with low-temperature growth is to obtain desorption of H atoms from the growing Si surface in order to leave room for subsequent Si adsorption and deposition. Using photons or plasma can help release H atoms thus permitting Si ALE. To avoid plasma induced damage, the photon approach can be used for epitaxy of Si and SiGe in order to realize monolayer control. A conventional UHV ALE or ALD system with an external laser source can be used to perform the ALE processes herein.

As shown in FIG. 2, process 200 further comprises properly stressing the Si emitter layer 120 (Step 225) and the SiGe base layer 130 (Step 235) so as to reduce transit times and to realize an operating frequency $f_T > 1.1$ THz for the SiGe HBT. Carrier mobility, and thereby device operation frequencies, can be significantly increased through introduction of combined uniaxial and biaxial strains in the heterojunction structure. This can be realized intrinsically through heterojunction growth and extrinsically by stressor-layer deposition. Heterojunctions, as such, are well-known to be beneficial for both carrier injection and carrier transport. Use of stressor layers for strain engineering can provide an extra degree of freedom for carrier mobility enhancement, as has been successfully shown for CMOS technology.

Figure 3D:
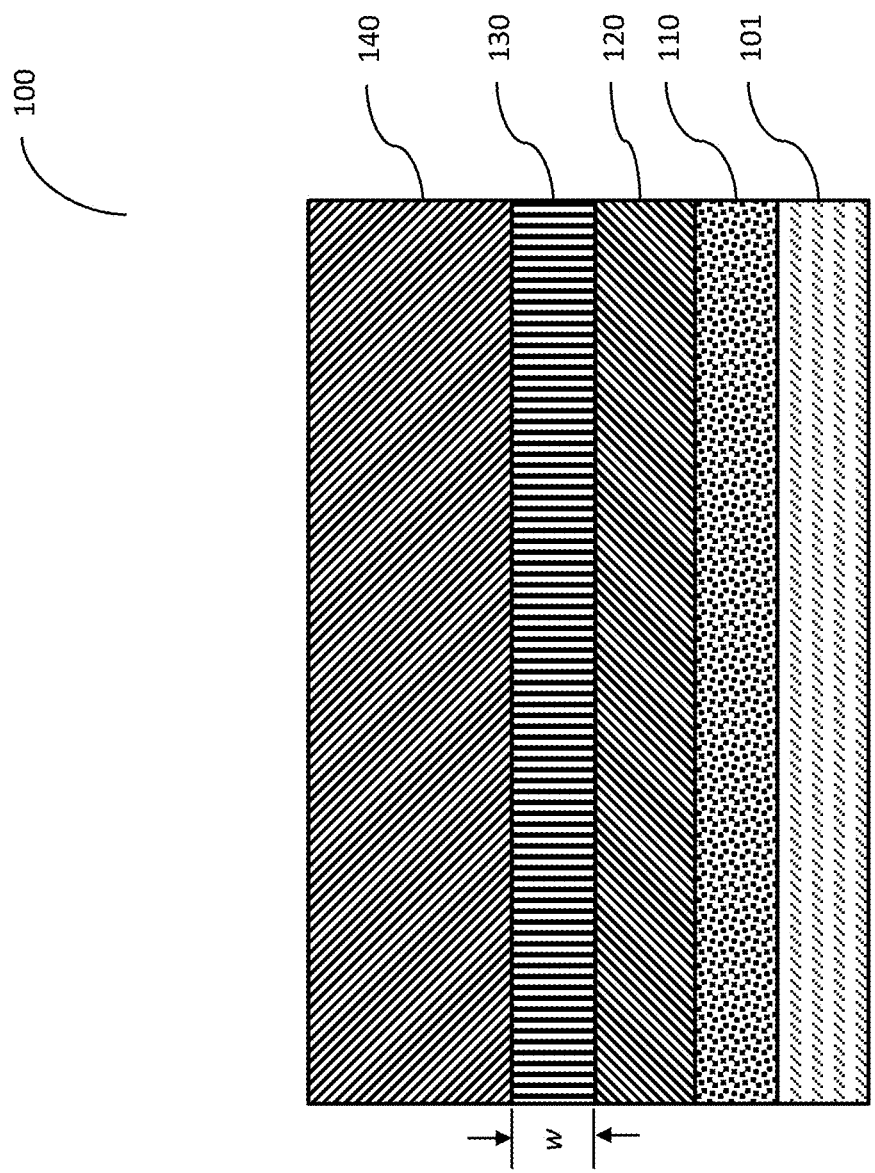

As shown in FIGS. 2 and 3d, a silicon layer 140 is formed by hetrojunction epitaxy process by ALE (Step 240). In order to maintain sharp dopant transition between different layers and to form, for example, a NPN HBT, emitter 120, base 130 and collector 140 are in-situ doped during ALE processes with N-, P- and N-type dopants respectively. For a NPN HBT according to one embodiment, under normal operation, a base-emitter bias ($V_{BE}$) is positive and the base-collector bias ($V_{BC}$) is negative.

Figure 3E:
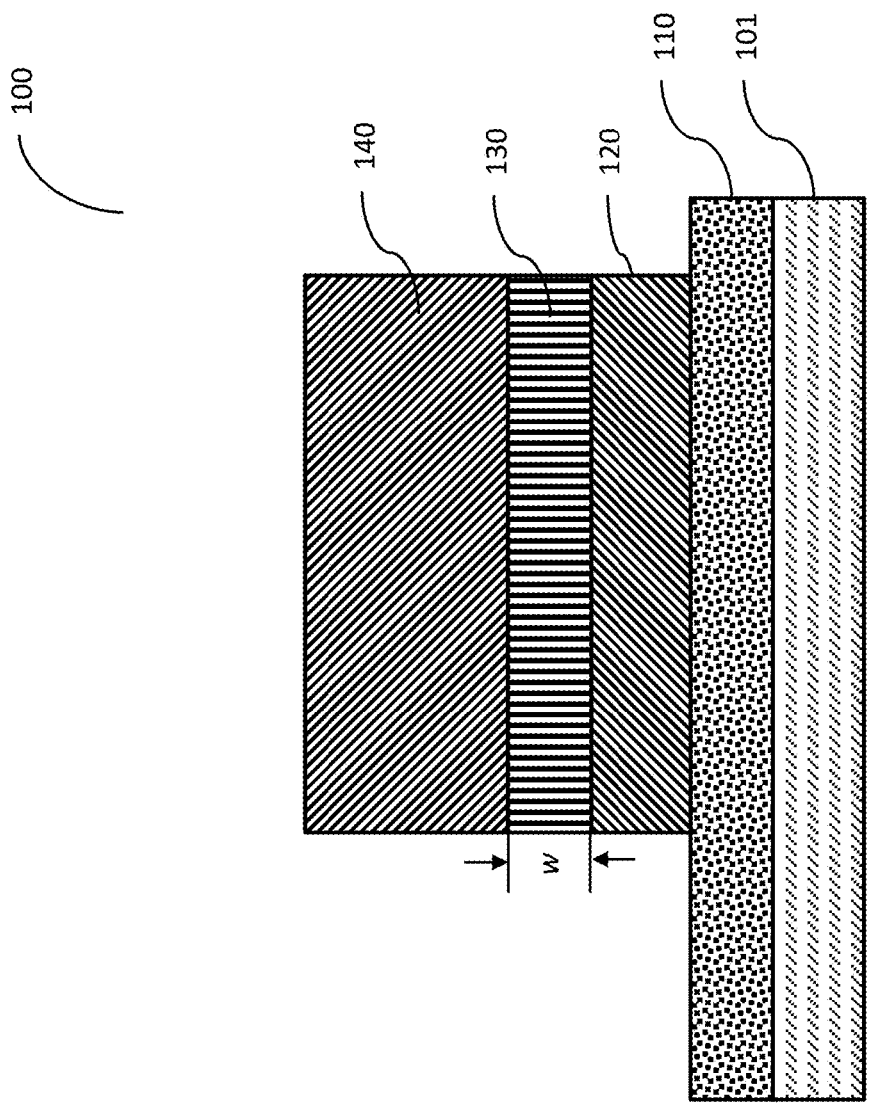
Figure 3F:
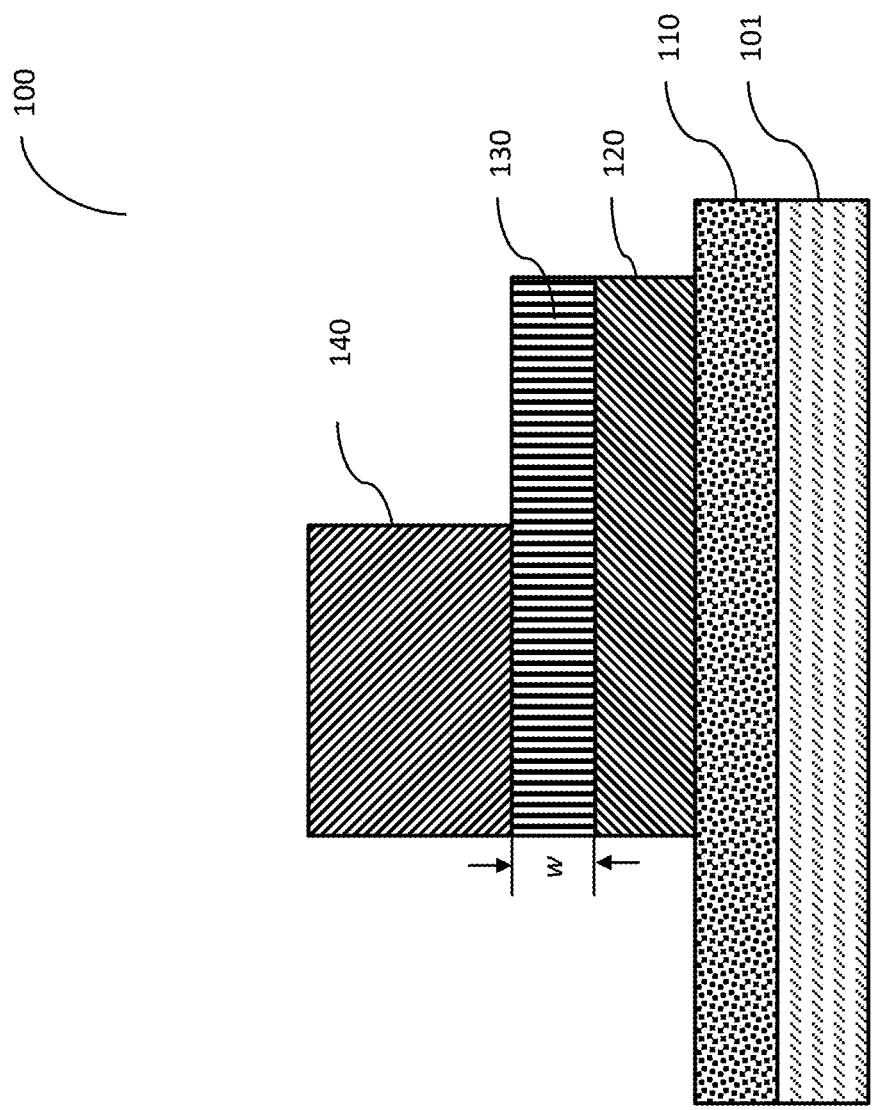
Figure 3G:
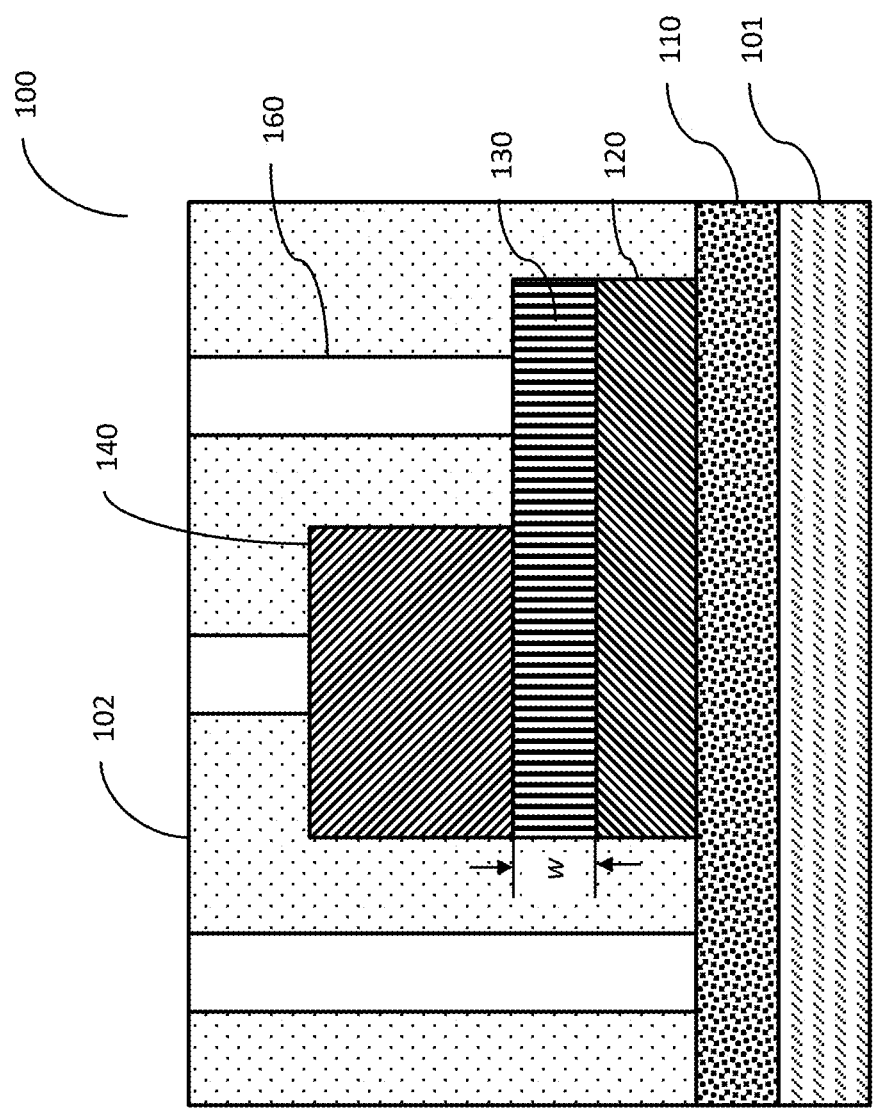

As shown in FIGS. 2, 3e-3f, the emitter layer 120, the base layer 130 and the collector layer 140 are patterned and mesa-etched in Steps 145 to form the emitter 120, the base 130, and the collector 140. As shown in FIG. 3g, an insulating dielectric layer 103 is deposited and then planarized, followed by contact hole formation inside the insulating dielectric layer 103. Contact holes 160 are used for subsequent formation of contacts on the emitter, base and collector.

Figure 3H:
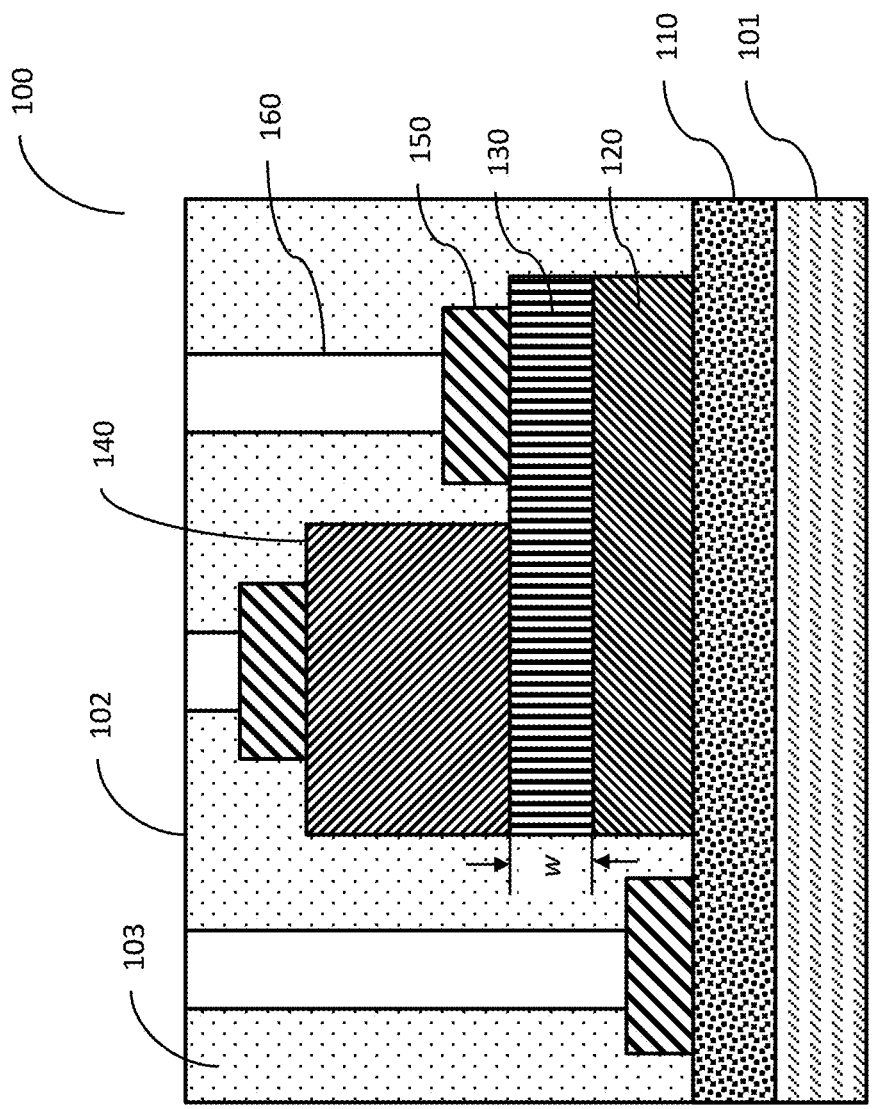

As shown in FIGS. 2 and 3h, electrical contacts are formed on the emitter, base and collector (Step 250). In one embodiment, a conventional self-aligned CMOS process can be used to form nickel silicide (NiSi) contacts without an additional lithography mask. Extremely low contact resistivities (e.g., below $10^{-8}$ $\Omega cm^2$) can be realized at the emitter and base, and extremely low Schottky barrier height (SBH) (e.g., around 0.1 eV) at the collector using dopant segregation (DS) techniques, such as those originally developed for metal-semiconductor contacts in CMOS technology. These should further boost the frequency performance of the SiGe HBT 100. Electrical contacts have, as of yet, received little attention in traditional HBT research. The contacts become an important issue for THz devices, since conventional heavy doping and choice of appropriate metals for low contact resistance are not as readily implementable, given the constraints of the HBT structure and its processing. Techniques such as dopant segregation for altering the Schottky barrier height between metal silicide and semiconductor can be applied in order to reduce the contact resistance of all three terminals.

Thus, a SiGe HBT is formed by atomic layer epitaxy (ALE) for heterojunction formation of ultrathin (e.g., <10 nm) semiconductors on epitaxial metal silicides. Strain engineering is used for simultaneous enhancement of lateral hole and vertical electron conduction in some or all regions of the HBT. The SiGe HBT has an inverted heterojunction structure, giving maximized frequency performance with reduced parasitics and better thermal processing budget for the critical base profile. New contact strategies are employed to provide extremely low contact resistances at some or at all the HBT terminals.

Thus, an inverted SiGe HBT capable of operating well into the THz-gap can be fabricated using semiconductor-based processes, in which a structure of Si, SiGe and Si(C) is established on a single-crystal silicide film using ALE processes. Alternatively, molecular beam epitaxy (MBE) can be employed for growth of the semiconductors. The surface and interface properties achieved with the epitaxial $NiSi_2$ films are important in enabling epitaxy of the various Si or SiGe films atop. For example, as shown by a RHEED image of a 10-nm thick epitaxial Si grown on an epitaxial $NiSi_2$ film at 380° C. in FIG. 4B, the quality of the growth surface is already reasonable although no elaborated surface preparation was made.

Figure 5:
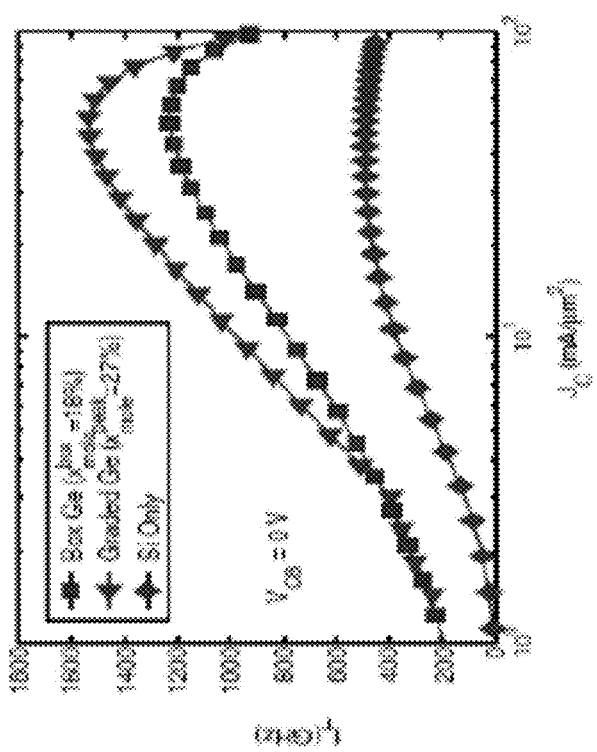
FIG. 5 is a graphical representation of simulation results on operating frequency $f_T$ vs collector current density Jc of a SiGe HBT optimised for high injection operation according to one embodiment.

FIG. 5 is a graph of operating frequency $f_T$ vs collector current density Jc of a SiGe HBT optimised for high injection operation, based on simulation results from the device structure of one embodiment in the present disclosure.

The performance advantages of the SiGe HBT primarily originate from the reduced bandgap of SiGe and accelerating vertical field from the bandgap gradient. Vertical electron mobility and lateral hole mobility, important for base resistance, however, show only small improvements. On the other hand, in the CMOS world, a key performance enhancement factor below 90 nm is lateral field mobility enhancement through strain engineering. In one embodiment, bandgap engineering mobility engineering are combined to further improve the HBT performance. For example, additional strain engineering can be used to improve lateral hole mobility, thus reducing base resistance, which limits the maximum operating frequency of the SiGe HBT.

We claim:

1. A method of making an HBT for operating in the TeraHertz Gap, comprising:
   epitaxially growing a single crystal metal silicide layer on a semiconductor substrate;
   epitaxially growing a single crystal silicon emitter on the metal silicide layer;
   epitaxially growing a base over the emitter; and
   epitaxially growing a single crystal silicon collector on the base;
   wherein the emitter is grown using an atomic layer epitaxy (ALE) process;
   wherein photons from a laser source are used during the ALE process to help release hydrogen atoms from a substrate surface.

2. The method of claim 1, wherein the metal silicide layer is $NiSi_2$ grown on Si(100) using a solid-state reaction (SSR) epitaxy process.

3. The method of claim 1, wherein the SSR process comprises sputter-deposition of a Ni film that is equal to or less than about ~2-nm thick followed by heat treatment.

4. The method of claim 1, wherein the emitter is in situ doped with carbon during the ALE process.

* * * * *